(12) United States Patent
Mikalo et al.

(10) Patent No.: US 10,256,134 B2
(45) Date of Patent: Apr. 9, 2019

(54) HEAT DISSIPATIVE ELEMENT FOR POLYSILICON RESISTOR BANK

(71) Applicant: GLOBALFOUNDRIES Inc., Grand Cayman (KY)

(72) Inventors: Ricardo P. Mikalo, Heideblick (DE); Martin Gerhardt, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/618,491

(22) Filed: Jun. 9, 2017

(65) Prior Publication Data

US 2018/0358259 A1    Dec. 13, 2018

(51) Int. Cl.
| | |
|---|---|
| *H01L 21/20* | (2006.01) |
| *H01L 21/76* | (2006.01) |
| *H01L 49/02* | (2006.01) |
| *H01L 23/367* | (2006.01) |

(52) U.S. Cl.
CPC ............ *H01L 21/76* (2013.01); *H01L 23/367* (2013.01); *H01L 28/20* (2013.01)

(58) Field of Classification Search
CPC ....... H01L 21/76; H01L 23/367; H01L 28/20; H01L 2224/06519; H01L 2224/30519
USPC ........................................................ 438/385
See application file for complete search history.

(56) References Cited

U.S. PATENT DOCUMENTS

| | | | |
|---|---|---|---|
| 6,436,747 B1 | 8/2002 | Segawa et al. | |
| 8,361,848 B2* | 1/2013 | Lee .................. | H01L 27/0629 438/171 |
| 8,748,256 B2 | 6/2014 | Zhao et al. | |
| 2005/0070102 A1 | 3/2005 | Coolbaugh et al. | |
| 2006/0194436 A1* | 8/2006 | Oh ..................... | H01L 27/08 438/689 |

* cited by examiner

*Primary Examiner* — Vu A Vu
(74) *Attorney, Agent, or Firm* — Anthony Canale; Hoffman Warnick LLC (57) ABSTRACT

An integrated circuit (IC) structure is disclosed. The structure can include: a first heat dissipative element disposed between a pair of shallow trench isolations (STIs) in a substrate, and a first polysilicon resistor in a polysilicon layer positioned over the substrate and the pair of STIs, the first polysilicon resistor in thermal communication with the first heat dissipative element. The structure can also include a second polysilicon resistor in the polysilicon layer, the second polysilicon resistor laterally separated from the first polysilicon resistor, and the first heat dissipative element in thermal communication with the first polysilicon resistor and the second polysilicon element. The structure can also include a second heat dissipative element, the second heat dissipative element in a different directional orientation than the first heat dissipative element.

18 Claims, 7 Drawing Sheets

HEAT DISSIPATIVE ELEMENT FOR POLYSILICON RESISTOR BANK

BACKGROUND

Technical Field

Aspects of the disclosure relate generally to integrated circuits (ICs). More specifically, embodiments of the present disclosure include an IC structure with a heat dissipative element for polysilicon resistors.

Related Art

Each IC of a particular device can be made up of billions of interconnected devices, such as transistors, resistors, capacitors, and diodes, located on one or more chips of semiconductor substrate material. The quality and viability of a product including an IC therein can be at least partially dependent on the techniques used for fabricating the IC and the structure of various components therein. As circuit speed demands increase, high transistor performance manufacturing processes using laser spike anneal (LSA) implant activation and/or other anneal processes are required. LSA processes, for example, may induce variability to polysilicon elements in the IC. For example, the cool-down of polysilicon elements, such as polysilicon resistors (hereinafter, poly-resistors) in a resistor bank, may vary in speed and electrical behavior among the elements due to differences in the heat conduction capability of nearby IC components. The speed of cool-down of polysilicon elements determines the amount of implant of the polysilicon elements staying activated. The slower cool-down of polysilicon elements near components with lower heat conduction capabilities may result in decreased implant activation, while the faster cool-down of polysilicon elements near components with higher heat conduction capabilities may result in increased implant activation. In the case of poly-resistors in a poly-resistor bank, for example an R-2R resistor network of an analog-to-digital (ADC) or digital-to-analog (DAC) converter circuit, this may result in variability of resistance across the bank.

SUMMARY

A first aspect of the disclosure provides a method for forming heat dissipative elements for polysilicon elements in an integrated circuit (IC) structure including: forming a heat dissipative element in a substrate by forming a pair of shallow trench isolations (STIs) within the substrate; forming a polysilicon layer over the plurality of STIs and the substrate; and forming a first poly-resistor in the polysilicon layer over at least a portion of a first STI and in thermal communication with the heat dissipative element, wherein a portion of the substrate between the pair of the STIs defines the heat dissipative element.

A second aspect of the disclosure provides an integrated circuit (IC) structure including: a first heat dissipative element disposed between a pair of shallow trench isolations (STIs) in a substrate, and a first poly-resistor in a polysilicon layer positioned over the substrate and the pair of STIs, wherein the first poly-resistor is in thermal communication with the first heat dissipative element.

A third aspect of the disclosure provides an integrated circuit (IC) structure including: a first shallow trench isolation (STI) in a substrate; a second STI in the substrate, the second STI laterally separated from the first STI; a heat dissipative material in the remaining portion of the substrate; a first poly-resistor in a polysilicon layer, the polysilicon layer positioned on the first STI, the second STI and the substrate; and a second poly-resistor in the polysilicon layer, wherein the heat dissipative material is in thermal communication with the first polysilicon element and the second polysilicon element.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings. The drawings may be rotated in any direction and are not limited to a particular orientation.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide integrated circuit (IC) structures with heat dissipative elements for mitigating and/or altogether preventing variability in cooling speed of polysilicon resistors (hereinafter, poly-resistors), for example, after a laser spike anneal (LSA) process. Among other things, IC structures according to the present disclosure can include a heat dissipative element in proximity of a polysilicon element conventionally surrounded by components with low heat conduction capabilities. For example, polysilicon resistor banks may include heat dissipative elements between shallow trench isolations (STIs) in the substrate below a layer of poly-resistors. Embodiments of the present disclosure can protect against variability in cooling speed of poly-resistors.

Figure 1A:
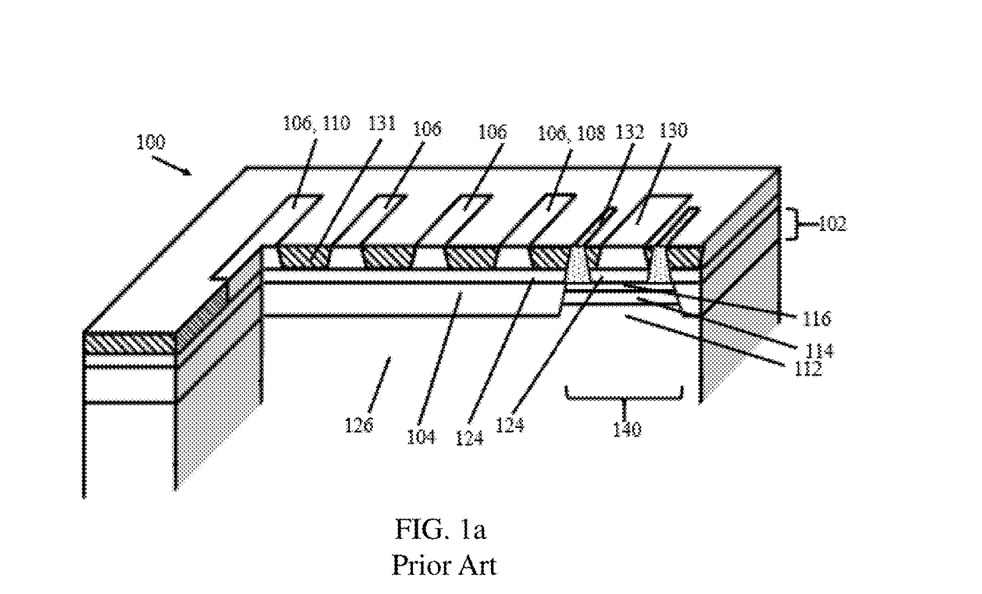
FIGS. 1a and 1b show conventional polysilicon resistor banks, according to the prior art.
Figure 1B:
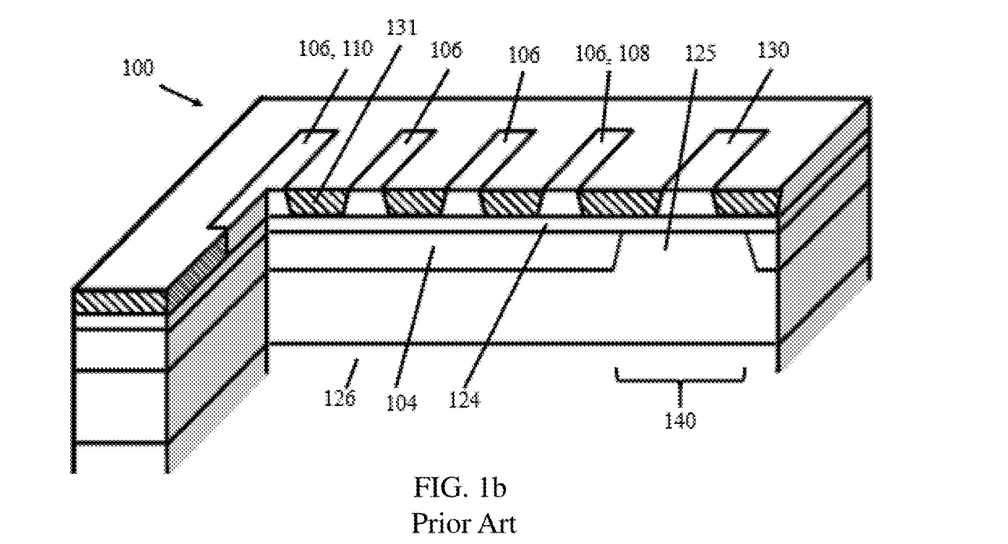

Referring to the drawings, FIGS. 1a and 1b, show conventional polysilicon resistor bank structures for an integrated circuit (IC). Polysilicon resistor bank 100 can include or otherwise be positioned over a shallow trench isolation (STI) 104 formed in a semiconductor-on-insulator (SOI) substrate 102 (see FIG. 1a) or in a bulk substrate (hereinafter "bulk") 125 (see FIG. 1b). As shown in FIGS. 1a and 1b, polysilicon resistor bank 100 may be formed over a gate oxide layer 124 positioned over SOI substrate 102 (see FIG. 1a) or bulk substrate 125 (see FIG. 1b). Polysilicon resistor bank structure 100 can include a plurality of poly-resistors 106 including, poly-resistors 108, 110 formed in a polysilicon layer (not labeled) which may later be removed.

As shown in FIG. 1a, SOI substrate 102 may include a semiconductor base substrate 112, an insulator layer 114 on semiconductor base substrate 112, and a semiconductor-on-insulator (SOI) layer 116 on insulator layer 114. Semiconductor base substrate 112 and SOI layer 116 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y2}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entirety of each layer may be strained. For example, SOI layer 116 (and/or epi layer thereover) may be strained. Insulator layer 114 may include any now known or later developed dielectric used for SOI layers, such as but not limited to silicon dioxide or sapphire. The choice of insulator depends largely on intended application, with sapphire being used for radiation-sensitive applications and silicon oxide preferred for improved performance and diminished short channel effects in microelectronics devices. The precise thickness of insulator layer 114 and topmost SOI layer 116 also vary widely with the intended application.

As shown in FIG. 1b, bulk substrate 125 may include, for example, an active bulk silicon or epi layer. Bulk substrate 125 may be formed, for example, by any now known or later developed semiconductor manufacturing processes for forming a bulk substrate. Bulk substrate 125 may include Silicon, Germanium, Silicon Germanium, Gallium Arsenide, Gallium Nitride, Silicon Carbide, Indium Arsenide, and/or any other now known or later developed material for a bulk substrate. The bulk substrate 125 may also include epitaxially deposited or grown semiconducting material (not shown). Bulk substrate 125 may be positioned on, for example, a bulk wafer silicon material 126. Bulk silicon wafer material 126 may be formed by any now known or later developed semiconductor manufacturing techniques for forming bulk silicon wafer material. Bulk silicon wafer material 126 may include any now known or later developed bulk silicon wafer material.

Gate oxide layer 124 (see FIGS. 1a and 1b) may be formed from Silicon Dioxide, Nitrided Silicon Dioxide, Zirconium Oxide, Lanthanum Oxide, Hafnium Oxide, Tantalum Oxide, Titanium Oxide, Rhenium Oxide, Praseodymium Oxide, Samarium Oxide, Silicon Nitride, Silicon Oxynitride, Germanium Oxide, Gallium Oxide, Iridium Oxide, Aluminum Oxide, Ytterbium Oxide, Yttrium Oxide, and/or any other now known or later developed material for forming a gate oxide layer. Gate oxide layer 124 may be formed, for example, by thermal oxidation, chemical radical oxidation, CVD, PVD, sputtering, condensation, epitaxial growth, ALD, pulsed laser deposition, and/or any now known or later developed semiconductor manufacturing techniques for forming a gate oxide layer.

Poly-resistors 106 of poly-resistor bank structure 100 may be formed using any now known or later developed semiconductor fabrication techniques including but not limited to photolithography (and/or sidewall image transfer (SIT)). In lithography (or "photolithography"), a radiation sensitive "resist" coating is formed, e.g., deposited, over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example. As shown in FIGS. 1a and 1b, poly-resistors 106 of poly-resistor bank structure 100 may, for example, be isolated by inter layer dielectric (ILD) 131. ILD 131 may include doped or undoped glasses, such as BPSG, BSG, PSG, TEOS, low-k-materials, such as amorphous silicon oxide, fluorinated silicate glass, hydrogen silesquioxane, carbon doped oxide, polyimide, parylene, PTFE, porous organic or inorganic materials, such as xerogels, aerogels, and/or any other now known or later developed material for ILDs. ILD 131 may be formed, for example, by CVD, PVD, sputtering, melting and floating, in-situ polymerization, ALD, and/or any other now known or later developed semiconductor manufacturing techniques for forming ILDs.

As shown in FIGS. 1a and 1b, poly-resistor bank structure 100 may be positioned proximate to other IC structures, for example, neighboring transistor 140. Neighboring transistor 140 may include, for example, a gate 130. Gate 130 may include, for example, polysilicon, metal, carbon, graphene, and/or any other now known or later developed materials for gates. Gate 130 may be formed from any now known or later developed semiconductor manufacturing techniques for forming a gate. As shown in FIG. 1a, neighboring transistor 140 may also include, for example, raised source/drain regions 132. Source/drain regions 132 may be formed by any now known or later developed semiconductor manufacturing techniques for forming source/drain regions.

Where materials are deposited, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

At a later stage in conventional processing, e.g., after an ion implantation of dopants for the process of forming source/drain (S/D) regions of the IC, an annealing process may be performed on the IC, including polysilicon resistor bank structure 100. For example, an implant activation anneal may be performed to activate the implanted dopant to form the S/D regions. The annealing process may include, for example, e.g. rapid thermal anneal (RTA), laser spike anneal (LSA), flash lamp anneal (FLA) thermal anneal, and/or any other now known or later developed annealing technique. After any anneal, for instance after a LSA or FLA process is performed on the IC including polysilicon resistor bank structure 100, for example, the poly-resistors (e.g. poly-resistors 108, 110) may begin to cool. In a conventional polysilicon resistor bank structure, such as polysilicon resistor bank structure 100, poly-resistors toward the outer edges of the polysilicon resistor bank structure may cool at a different rate than the poly-resistors toward the center of the polysilicon resistor bank structure. Poly-resistors located toward the outer edge of the polysilicon resistor bank are closer in proximity to portions of the IC, which have a higher heat conduction capability than the STI, and therefore cool at a faster rate than poly-resistors located toward the center of the polysilicon resistor bank and generally surrounded by the STI. For example, poly-resistor 108, located toward an edge of polysilicon resistor bank 100 and closer to e.g. neighboring transistors 140, may cool faster than poly-resistor 110, located toward the center of polysilicon resistor bank 100 and surrounded by STI 104. The rate of cool down of a poly-resistor determines the amount of implant which stays activated, and therefore, the poly-resistors toward the outer edge of the polysilicon resistor bank generally experience a higher greater implant activation than poly-resistors toward the center of the polysilicon resistor bank. The result may include, for example, poly-resistors of varying implant activation across the polysilicon resistor bank.

As shown in FIGS. 2-10, in contrast to conventional polysilicon resistor banks, embodiments of the disclosure include forming heat dissipative elements 250 below the poly-resistors (e.g., poly-resistors 108, 110 in FIG. 1) of the polysilicon resistor bank structure 200.

Figure 2:
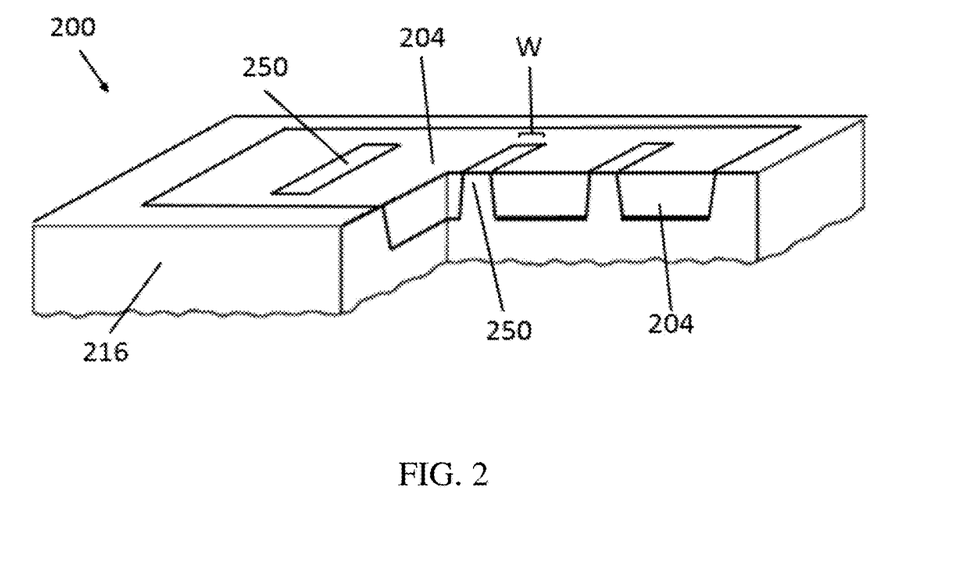
FIG. 2 shows forming heat dissipative elements for a polysilicon resistor bank according to embodiments of the disclosure.

FIG. 2 shows forming heat dissipative elements 250 by forming multiple and/or patterned shallow trench isolations (STIs) 204 in, for example, a bulk semiconductor wafer material or in a semiconductor-on-insulator (SOI) layer 216 of an SOI substrate, according to embodiments of the disclosure. As shown in FIG. 2, the remainder of SOI layer 216 or bulk 125 disposed between STIs 204 defines heat dissipative elements 250. Heat dissipative elements 250 may include, for example, a width W. Width W may, for example, be approximately 40 nanometers (nm) to approximately 5 micrometers (μm). Heat dissipative elements 250 may, for example, include the same material as SOI substrate 216 or bulk 125.

Heat dissipative elements 250 may include any now known or later developed material with any desirable heat conduction capability for mitigating and/or preventing uneven cooling of poly-resistors 206 (see FIG. 3).

Although FIG. 2 shows three heat dissipative elements formed by forming a single patterned STI 204, polysilicon resistor bank structure 200 may include any number of STIs in any directional locations and/or patterns which may allow any number of heat dissipative elements 250 to be in thermal communication with at least one poly-resistor 206. For example, STIs 204 may include multiple STIs parallel to one another (see FIG. 8) and/or patterned STIs to form various patterns of heat dissipative elements (see FIGS. 4-10). STIs 204, may be formed by any now known or later developed semiconductor techniques for forming STIs. For example, STIs 204 may be created by etching (e.g., by RIE) a pattern of trenches (not labeled) into SOI layer 216 or bulk 125, and subsequently filling (e.g., by depositing) the trenches with insulating material (e.g., silicon dioxide, BPSG, HARP, SOG, IMG, and/or any other low-k fill material now known or later developed). For example, patterns of trenches (not labeled) may be formed using patterned masks (not shown) to allow etching of only portions of SOI layer 216 not covered by the mask.

Although shown in the approximately rectangular geometry in example of FIG. 2, as will be discussed herein, heat dissipative elements 250 may be formed in any geometry and/or size desirable to allow heat dissipative elements 250 to be in thermal communication with poly-resistors 206 thereabove and mitigate and/or prevent uneven cooling rates of poly-resistors 206 in polysilicon resistor bank structure 200. As will also be discussed above and will be discussed further herein, any number of heat dissipative elements 250 may be formed in any location in SOI layer 216 or bulk 125, with respect to poly-resistors 206, as may be desirable to mitigate and/or prevent uneven cooling rates of poly-resistors 206. As discussed above and as will be discussed further herein, heat dissipative elements 250 may be formed in any combination of directional orientations as may be desirable to mitigate and/or prevent uneven cooling rates of poly-resistors 206.

Figure 3:
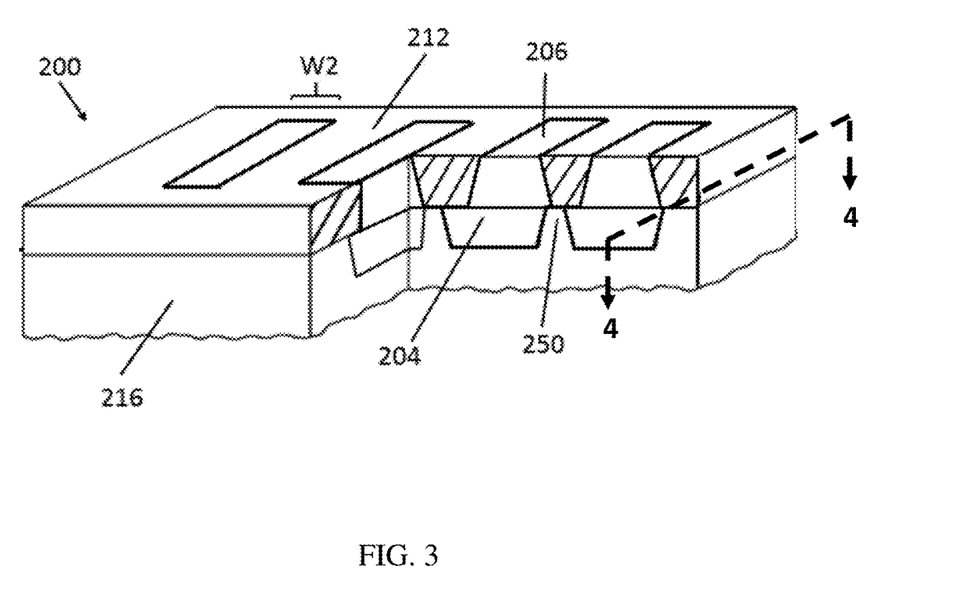
FIG. 3 shows an example of forming poly-resistors over the heat dissipative elements of FIG. 2 according to embodiments of the disclosure.

FIG. 3 shows a cut-out view of forming multiple poly-resistors 206 positioned over STIs 204, and SOI substrate 216 or bulk 125 including heat dissipative elements 250 (see FIG. 2) with poly-resistors 206 isolated from one another by inter layer dielectric (ILD) 212, according to embodiments of the disclosure. A polysilicon layer (not shown) may be formed, for example, on STIs 204 and heat dissipative elements 250. The polysilicon layer (not shown) may be formed by a deposition process and structured, for example, by photolithography to form poly-resistors 206. The polysilicon layer may be formed from any now known or later developed material desirable for a polysilicon layer in polysilicon resistor bank structure 200. The remainder of the polysilicon layer not structured into poly-resistors 206 may be removed, for example, and poly-resistors 206 may be isolated by subsequent filling with ILD 212 around the poly-resistors. Poly-resistors 206 may be formed by any now known or later developed semiconductor manufacturing techniques for forming poly-resistors. For example, poly-resistors 206 may be formed by doping selected portions of the polysilicon layer (not shown), e.g., exposed by masks (not shown). As shown in FIG. 3, poly-resistors 206 may include, for example, a width W2. Width W2 may, for example, be approximately 20 nm to approximately 5000 nm.

Although four poly-resistors 206 are shown, any desirable number of poly-resistors for polysilicon resistor bank structure 200 may be formed. Although shown in an approximately rectangular geometry, as will be discussed herein, poly-resistors 206 may be formed in any desirable geometry and/or size for poly-resistors. Although shown to be formed only over STIs 204, as will be discussed herein, poly-resistors 206 may also be formed, for example, over a portion of heat dissipative elements 250. Although shown in the same directional orientation, poly-resistors 206, may be formed in any desirable directional orientation for poly-resistors 206.

After formation of poly-resistors 206, conventional semiconductor manufacturing techniques for the formation of the IC may be performed. For example, the remainder of polysilicon layer (not shown) not creating poly-resistors 206 may be removed following the formation of poly-resistors 206. In another subsequent step of IC formation, as discussed above with respect to FIG. 1, a laser spike anneal (LSA) or any other anneal method may be performed. During the cooling of poly-resistors 206 after the LSA, heat dissipative elements 250 may, for example, allow the poly-resistors located towards the center of polysilicon resistor bank structure 200 to cool at an approximately similar rate as the poly-resistors towards the outer edge of the polysilicon resistor bank 200. Heat dissipative elements 250 may, for example, mitigate and/or prevent variations in the amount of implant activation of poly-resistors in polysilicon resistor bank 200.

Figure 4:
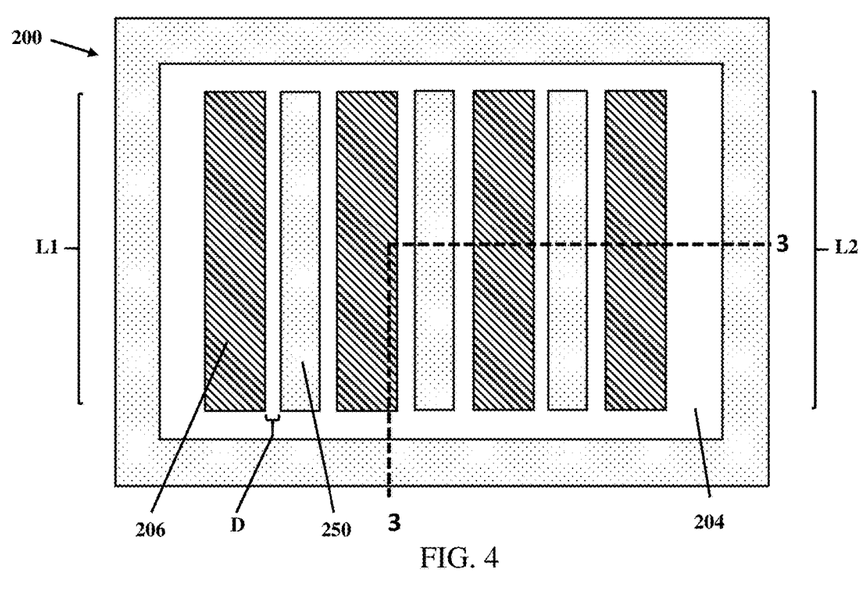
FIG. 4 shows a top view of the layout of the poly-resistors and heat dissipative elements of FIG. 3, according to embodiments of the disclosure.

FIG. 4 shows a top view of polysilicon resistor bank structure 200 of FIG. 3 at the cross-section line shown in FIG. 3. Although shown to all be in one layer in the top-view of FIG. 4 (as well as FIGS. 5-11) for simplicity, the poly-resistors are positioned in the layer on the STIs and heat dissipative elements. Polysilicon resistor bank structure 200 may include, for example, an array of alternating poly-resistors 206 and heat dissipative elements 250. Poly-resistors 206 and/or heat dissipative elements 250 may, for example, be approximately rectangular. Poly-resistors 206 may, for example, be laterally separated from heat dissipative elements 250 of the SOI layer therebelow. In the example of FIG. 4, a distance D between a lateral edge of a heat dissipative element 250 and a lateral edge of an adjacent poly-resistor 206 may be approximately 20 nm to approximately 500 nm. Heat dissipative elements 250 may, for example, be formed in a same directional orientation as poly-resistors 206. For example, heat dissipative elements 250 may be parallel to poly-resistors 206. As shown in the example of FIG. 4, a length L1 of heat dissipative elements 250 may, for example, be approximately equal to a length L2 of poly-resistors 206. Poly-resistors 206 may be positioned, for example, completely over portions of STI 204.

FIGS. 5-11 show a top view of example layouts of polysilicon resistor bank structures with heat dissipative elements according to embodiments of the disclosure. The poly-resistors may be in thermal communication with the heat dissipative elements. For example, the poly-resistors may intersect the heat dissipative elements therebelow. The polysilicon resistor bank structure may include any desirable pattern of heat dissipative elements and/or poly-resistors and/or STIs for preventing and/or mitigating uneven cooling of the poly-resistors. For example, the layouts of FIGS. 5-11 and elements illustrated therein are not limited in directional orientation and may, for example, be rotated in any way which may be desirable for mitigating and/or preventing uneven cooling of the poly-resistors. As discussed above, the heat dissipative elements, poly-resistors, and STIs may include any desirable geometry, size, position, directional orientation, number, spacing etc. for mitigating and/or preventing uneven cooling of the poly-resistors. As discussed above, the following layouts and descriptions are, therefore, merely illustrative.

Figure 5:
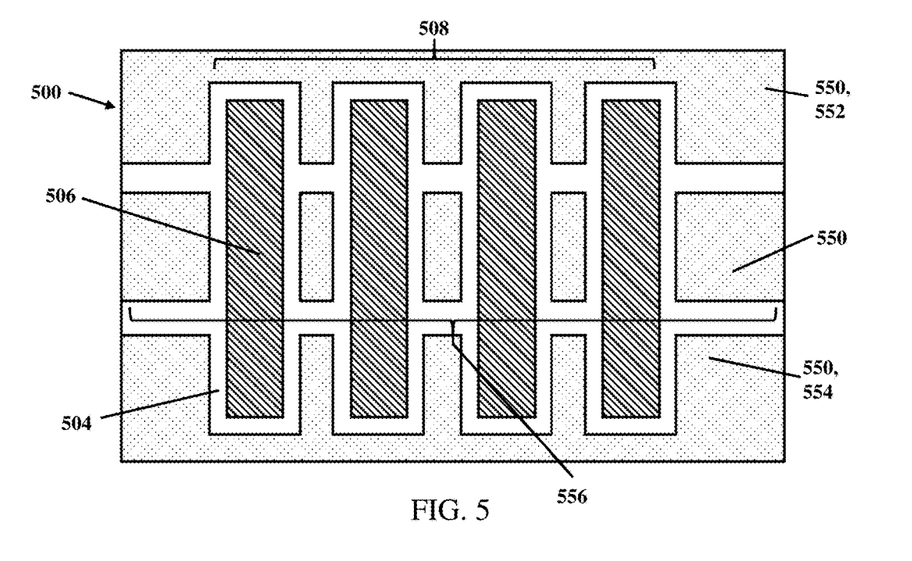
FIG. 5 shows a top view of a layout of poly-resistors and heat dissipative elements, according to embodiments of the disclosure.

FIG. 5 shows a top view of a layout of a polysilicon resistor bank structure 500 according to embodiments of the disclosure. Polysilicon resistor bank structure 500 may include, for example, an array 508 of poly-resistors 506 positioned above a single STI 504 and one or more heat dissipative elements 550. FIG. 5 shows four poly-resistors 506, however, it is to be understood that any number of poly-resistors 506 may be provided within polysilicon bank structure 500 without departing from aspects of the disclosure. Further, FIG. 5 shows poly-resistors 506 being substantially rectangular in shape and substantially parallel to one another in positioning within polysilicon bank structure 500, however, it is to be understood that any geometry and orientation of poly-resistors 506 may be provided within polysilicon bank structure 500 without departing from aspects of the disclosure. Each poly-resistor may, for example, be positioned entirely over a portion of STI 504. Polysilicon resistor bank 500 may also include, for example, a first heat dissipative element 552 surrounding an upper end of the portions of STI 504 above which each poly-resistor 506 is positioned. Polysilicon resistor bank 500 may also include, for example, a second heat dissipative element 554 surrounding a lower end of the portion of each STI 504 above which each poly-resistor 506 is positioned. First heat dissipative element 552 and second heat dissipative element 554 may, for example, be substantially perpendicular to poly-resistors 506 of array 508. First heat dissipative element 552, second heat dissipative element 554 and array 556 may, for example, be laterally separated from and substantially parallel to one another. Polysilicon resistor bank structure 500 may include, for example, an array 556 of five, substantially parallel heat dissipative elements 550 such that each heat dissipative element 550 within array 556 alternates with poly-resistors 506 of array of poly-resistors 508. Heat dissipative elements 550 of array 556 may, for example, be substantially parallel to and share a centerline with poly-resistors 506 of array 508.

Figure 6:
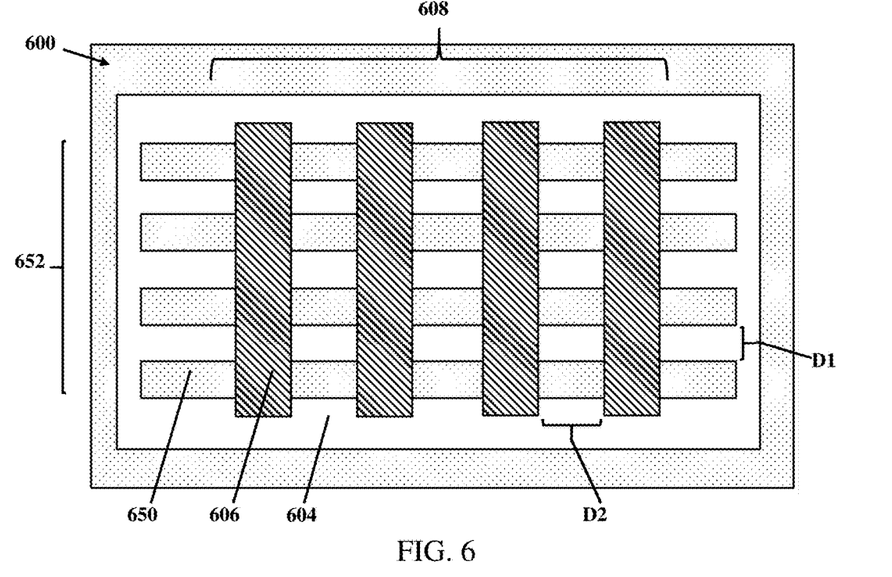
FIG. 6 shows a top view of a layout of poly-resistors and heat dissipative elements, according to embodiments of the disclosure.

FIG. 6 shows a top view of a layout of a polysilicon resistor bank structure 600 according to embodiments of the disclosure. As shown in FIG. 6, polysilicon resistor bank structure 600 may include, for example, an array 608 of poly-resistors 606 over heat dissipative elements 650 and a single STI 604. FIG. 6 shows four poly-resistors 606, however, it is to be understood that any number of poly-resistors 606 may be provided within polysilicon bank structure 600 without departing from aspects of the disclosure. Further, FIG. 6 shows poly-resistors 606 being substantially rectangular and substantially parallel to one another in positioning within polysilicon bank structure 600, however, it is to be understood that any geometry and orientation of poly-resistors 606 may be provided within polysilicon bank structure 600 without departing from aspects of the disclosure. Poly-resistors 606 may be positioned, for example, over a portion of STI 604 and a portion of each heat dissipative element 650. Polysilicon resistor bank structure 600 may include, for example, an array 652 of heat dissipative elements 650 in a directional orientation substantially perpendicular to the directional orientation of poly-resistors 606. FIG. 6 shows four heat dissipative elements 650, however, it is to be understood that any number of heat dissipative elements 650 may be provided within polysilicon bank structure 600 without departing from aspects of the disclosure. Further, FIG. 6 shows heat dissipative elements 650, for example, as approximately rectangular and approximately parallel to one another, however, it is to be understood that any geometry and orientation of heat dissipative elements 650 may be provided within polysilicon bank structure 600 without departing from aspects of the disclosure. A distance D1 between heat dissipative elements 650 may, for example, be approximately 40 nm to approximately 1000 nm. A distance D2 between poly-resistors 206 may, for example, in the example of FIG. 6, be approximately 20 nm and approximately 5000 nm.

Figure 7:
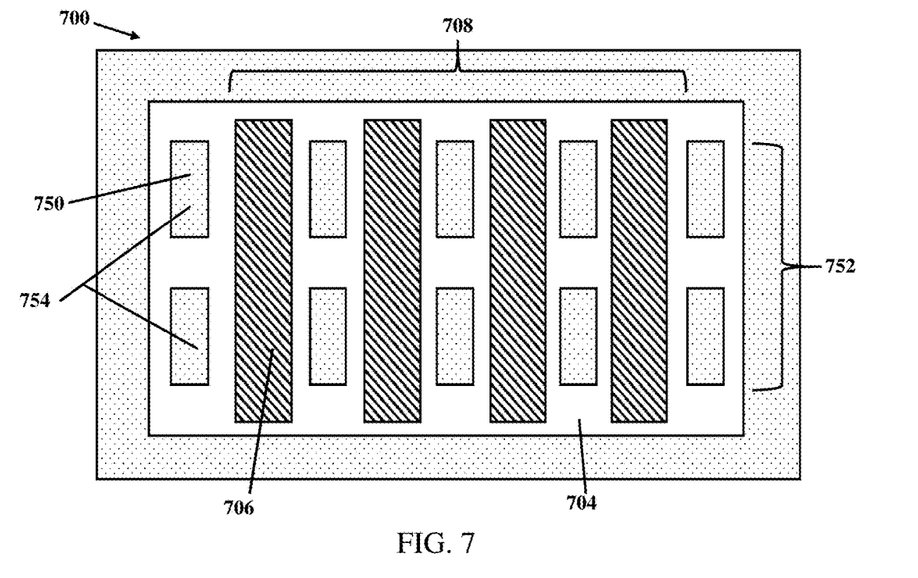
FIG. 7 shows a top view of a layout of poly-resistors and heat dissipative elements, according to embodiments of the disclosure.

FIG. 7 shows a top view of a layout of a polysilicon resistor bank structure 700 according to embodiments of the disclosure. As shown in FIG. 7, polysilicon resistor bank structure 700 may include, for example, an array 708 of poly-resistors 706 over heat dissipative elements 750 and a single STI 704. FIG. 7 shows four poly-resistors 706, however, it is to be understood that any number of poly-resistors 706 may be provided within polysilicon bank structure 700 without departing from aspects of the disclosure. Further, FIG. 7 shows poly-resistors 706 being substantially rectangular and substantially parallel to one another in positioning within polysilicon bank structure 700, however, it is to be understood that any geometry and orientation of poly-resistors 706 may be provided within polysilicon bank structure 500 without departing from aspects of the disclosure. Poly-resistors 706 may be positioned, for example, entirely over portions of STI 704. Polysilicon resistor bank structure 700 may include, for example, an array 752 of coincident pairs 754 of substantially rectangular heat dissipative elements 750. Each pair 754 may be substantially parallel to another pair 754. Each pair 754 may, for example, be substantially parallel to and alternate with poly-resistors 706 of array 708. It is to be understood that any number, geometry and orientation of heat dissipative elements 750 may be provided within polysilicon bank structure 700 without departing from aspects of the disclosure.

Figure 8:
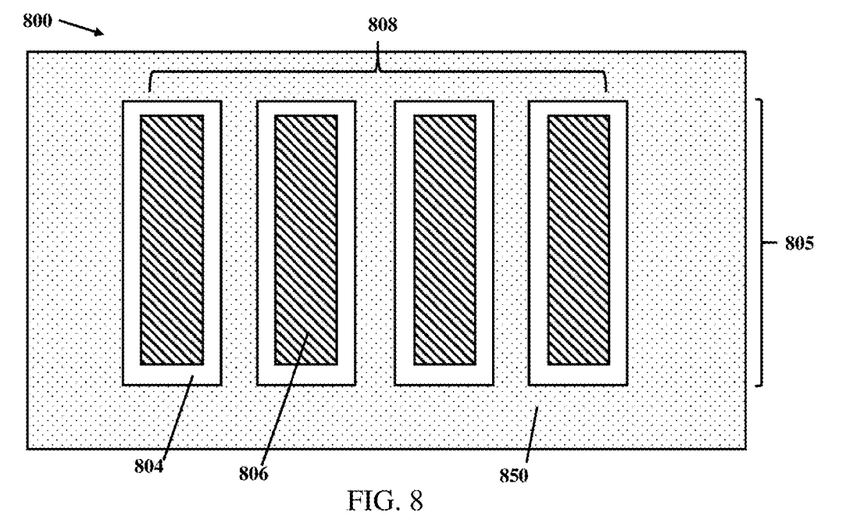
FIG. 8 shows a top view of a layout of poly-resistors and heat dissipative elements, according to embodiments of the disclosure.

FIG. 8 shows a top view of a layout of a polysilicon resistor bank structure 800 according to embodiments of the disclosure. As shown in FIG. 8, polysilicon resistor bank structure 800 may include, for example, an array 808 of poly-resistors 806 over STIs 804 and a single heat dissipative element 850. FIG. 8 shows four poly-resistors 806, however, it is to be understood that any number of poly-resistors 806 may be provided within polysilicon bank structure 800 without departing from aspects of the disclosure. Further, FIG. 8 shows poly-resistors 806 being substantially rectangular and substantially parallel to one another in positioning within polysilicon bank structure 800, however, it is to be understood that any geometry and orientation of poly-resistors 806 may be provided within polysilicon bank structure 800 without departing from aspects of the disclosure. The polysilicon resistor bank structure may also include, for example, an array 805 of four, substantially rectangular and substantially parallel, STIs 804. Each poly-resistor 806 may be positioned, for example, completely over an STI 804 of the array 805. The length and width of each STI 804 may, for example, be larger than a respective height and width of the poly-resistor 806 in the plane above it. Polysilicon resistor bank structure 800 may also include a single heat dissipative element 850 surrounding the each STI 804. Single heat dissipative element 850 may, for example, be in thermal communication with all of the poly-resistors of array 808.

Figure 9:
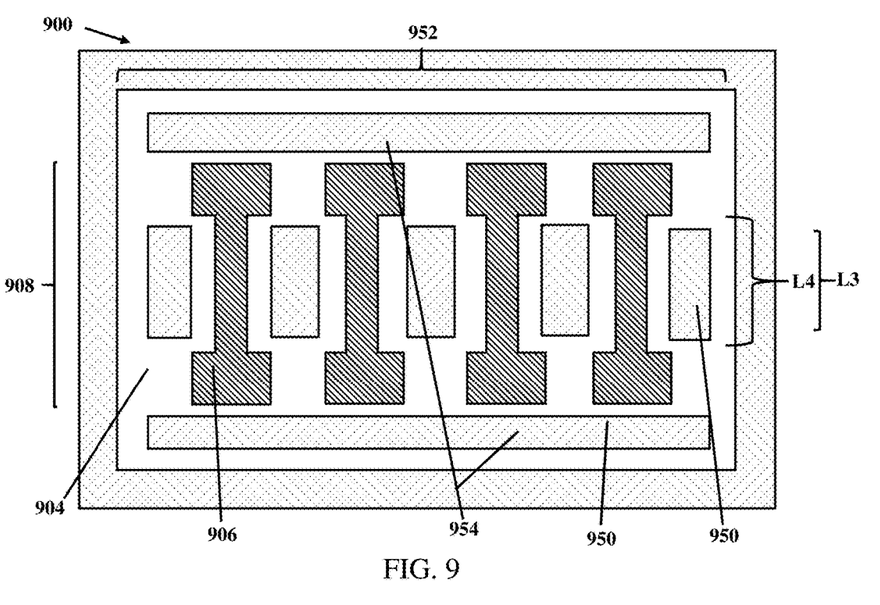
FIG. 9 shows a top view of a layout of poly-resistors and heat dissipative elements, according to embodiments of the disclosure.

FIG. 9 shows a top view of a layout of a polysilicon resistor bank structure 900 according to embodiments of the disclosure. Polysilicon resistor bank structure 900 may include, for example, an array 908 poly-resistors 906 over one STI 904 and heat dissipative elements 950. FIG. 9 shows four poly-resistors 906, however, it is to be understood that any number of poly-resistors 906 may be provided within polysilicon bank structure 900 without departing from aspects of the disclosure. Further, FIG. 9 shows poly-resistors 906 being substantially I-shaped and substantially parallel to one another in positioning within polysilicon bank structure 900, however, it is to be understood that any geometry and orientation of poly-resistors 906 may be provided within polysilicon bank structure 900 without departing from aspects of the disclosure. Poly-resistors 906 may be positioned, for example, completely over a portion of STI 904. Polysilicon resistor bank structure 900 may also include, for example, an array 952 of heat dissipative elements 950. FIG. 9 shows five heat dissipative elements 950 in array 952, however, it is to be understood that any number of heat dissipative elements 950 may be provided within polysilicon bank structure 900 without departing from aspects of the disclosure. Further, FIG. 9 shows heat dissipative elements 950 being substantially rectangular in shape and substantially parallel to one another in positioning within polysilicon bank structure 900, however, it is to be understood that any geometry and orientation of heat dissipative elements 950 may be provided within polysilicon bank structure 900 without departing from aspects of the disclosure. The heat dissipative elements 950 of array 952 may, for example, be parallel to and alternate with the poly-resistors 906 of array 908. The heat dissipative elements of array 952 may for example, include a length L3 shorter than a length L4 of the neck of I-shaped poly-resistors 906 of array 908. Polysilicon resistor bank structure 900 may also include, for example a pair 954 heat dissipative elements 950 that are perpendicular to and extending along an upper and lower end of array 908 of poly-resistors 906. FIG. 9 shows the heat dissipative elements of pair 954 as being substantially rectangular in shape and substantially parallel to one another in positioning within polysilicon bank structure 900.

Figure 10:
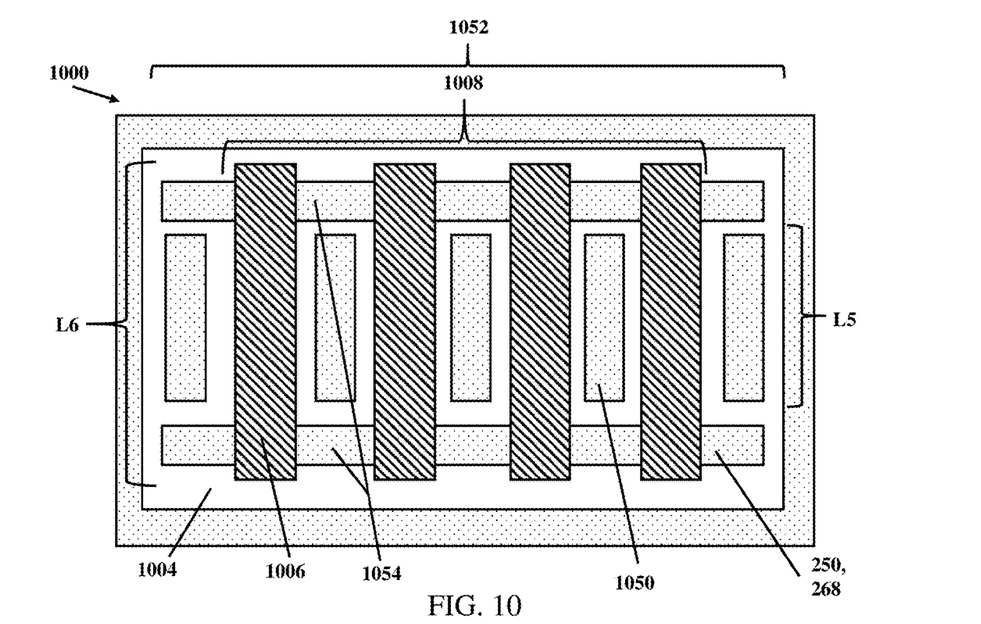
FIG. 10 shows a top view of a layout of poly-resistors and heat dissipative elements, according to embodiments of the disclosure.

FIG. 10 shows a top view of a layout of a polysilicon resistor bank structure 1000 according to embodiments of the disclosure. Polysilicon resistor bank structure 1000 may include, for example, an array 1008 of poly-resistors 1006 over a single STI 1004 and one or more heat dissipative elements 1050. FIG. 10 shows four poly-resistors 1006, however, it is to be understood that any number of poly-resistors 1006 may be provided within polysilicon bank structure 1000 without departing from aspects of the disclosure. Further, FIG. 10 shows poly-resistors 1006 being substantially rectangular in shape and substantially parallel to one another in positioning within polysilicon bank structure 1000, however, it is to be understood that any geometry and orientation of poly-resistors 1006 may be provided within polysilicon bank structure 1000 without departing from aspects of the disclosure. Polysilicon resistor bank structure 1000 may include, for example, an array 1052 of heat dissipative elements 1050. FIG. 10 shows heat dissipative elements 1050 being substantially rectangular in shape and substantially parallel to one another in positioning within polysilicon bank structure 1000, however, it is to be understood that any geometry and orientation of heat dissipative elements 1050 may be provided within polysilicon bank structure 1000 without departing from aspects of the disclosure. Heat dissipative elements 1050 may be positioned parallel to and alternating with poly-resistors 1006 of array 1008. Each heat dissipative element 1050 of array 1008 may include, for example, a length L5 less than a length L6 of poly-resistors 1006 of array 1008. Polysilicon resistor bank 1000 may also include, for example, a set 1054 of substantially rectangular and substantially parallel heat dissipative elements 1050. Set 1054 may be perpendicular to heat dissipative elements 1050 of array 1052 and extend along an upper and lower end of array 1052 of heat dissipative elements 1050. Poly-resistors 1006 may be positioned, for example, over a portion of STI 1004 and portions of each heat dissipative element 1050 of set 1054.

Figure 11:
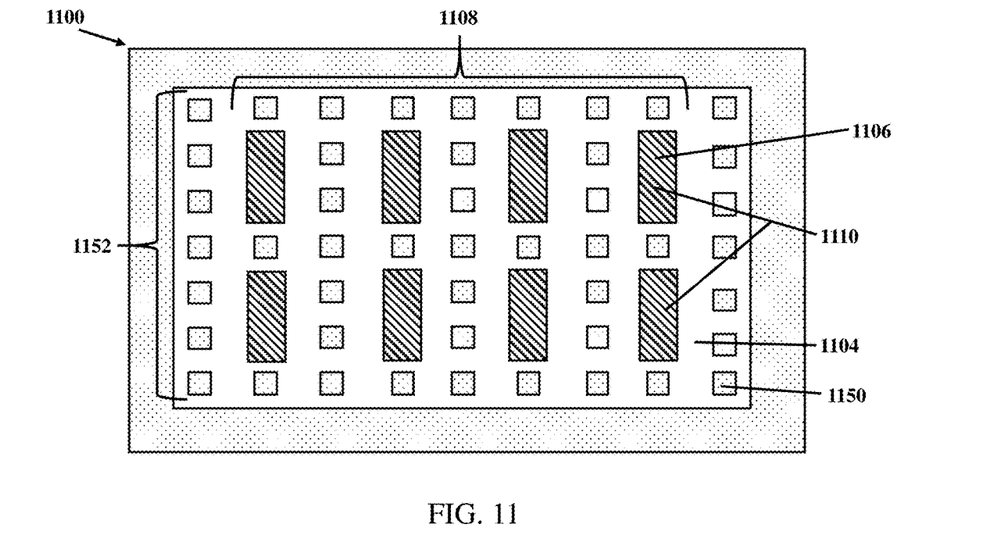
FIG. 11 shows a top view of a layout of poly-resistors and heat dissipative elements, according to embodiments of the disclosure.

FIG. 11 shows a top view of a layout of a polysilicon resistor bank structure 1100 according to embodiments of the disclosure. Polysilicon resistor bank structure 1100 may include, for example, an array 1108 of poly-resistors 1106 over a single STI 1104 and one or more heat dissipative elements 1150. Array 1108 may include pairs 1110 of substantially coincident poly-resistors 1106, each pair 1110 substantially parallel to one another. FIG. 11 shows four sets of poly-resistors 1106, however, it is to be understood that any number of poly-resistors 1106 may be provided within polysilicon bank structure 1100 without departing from aspects of the disclosure. Further, FIG. 11 shows poly-resistors 1106 being substantially rectangular in shape and substantially parallel to one another in positioning within polysilicon bank structure 1100, however, it is to be understood that any geometry and orientation of poly-resistors 1106 may be provided within polysilicon bank structure 1100 without departing from aspects of the disclosure. Poly-resistors 1106 may be positioned, for example, completely over a portion of STI 1104. Polysilicon resistor bank structure 1100 may also include an array 1152 of substantially square heat dissipative elements 1150 surrounding poly-resistors 1106 of array 1108, however, it is to be understood that any geometry and orientation of heat dissipative elements 1150 may be provided within polysilicon bank structure 1100 without departing from aspects of the disclosure. More specifically, square heat dissipative elements 1150 may include a substantially uniform length along each side of dissipative element 1150. As shown, for example, two heat dissipative elements 1150 may be positioned along each side of a poly-resistor 1106 and a single dissipative element 1150 may be positioned along each of an upper and lower end of each poly-resistor 1106.

The layouts of the polysilicon resistor bank elements shown in FIGS. 4-11 may, for example, allow heat dissipative elements to be in thermal communication with poly-resistors of the polysilicon resistor bank and therefore prevent and/or mitigate uneven cooling of poly-resistors after any anneal process such as, for example, an LSA process. As discussed above, the above layouts and descriptions are merely exemplary. Polysilicon resistor bank may, for example, incorporate a layout including any number of heat dissipative element in thermal communication with poly-resistors to prevent and/or mitigate uneven cooling of the poly-resistors.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
a first heat dissipative element laterally surrounded by at least one shallow trench isolation (STI) in a substrate;
a first polysilicon resistor in a polysilicon layer positioned over the substrate and the at least one STI; and
a second polysilicon resistor in the polysilicon layer, wherein the second polysilicon resistor is laterally separated from the first polysilicon resistor,
wherein the first polysilicon resistor and the second polysilicon resistor are in thermal communication with the first heat dissipative element.

2. The IC structure of claim 1, wherein the first heat dissipative element is laterally separated from the first polysilicon resistor.

3. The IC structure of claim 2, wherein a distance between the first heat dissipative element and the first polysilicon resistor is approximately 20 nanometers to approximately 500 nanometer.

4. The IC structure of claim 1, wherein a width of the first polysilicon resistor is approximately 20 nanometers to approximately 5000 nanometers, and wherein the first polysilicon resistor is in direct contact with at least one of the first heat dissipative element or the at least one STI.

5. The IC structure of claim 1, wherein a width of the first heat dissipative element is approximately 40 nanometers to approximately 5 micrometers.

6. The IC structure of claim 1, wherein a directional orientation of a length of the first polysilicon resistor is perpendicular to a directional orientation of a length of the first heat dissipative element.

7. The IC structure of claim 6, further comprising a second heat dissipative element in the substrate laterally separated from the first heat dissipative element, wherein a directional orientation of a length of the second heat dissipative element is parallel to a directional orientation of the length of the first heat dissipative element.

8. The IC structure of claim 7, wherein a distance between the first heat dissipative element and the second heat dissipative element is 40 nanometers to approximately 1000 nanometers.

9. The IC structure of claim 6, further comprising a second heat dissipative element in the substrate, wherein a directional orientation of a length of the second heat dissipative element is perpendicular to a directional orientation of the length of the first heat dissipative element.

10. The IC structure of claim 9, wherein a distance between the first polysilicon resistor and the second polysilicon resistor is approximately 20 nanometers to approximately 1000 nanometers.

11. The IC structure of claim 1, wherein a portion of the first polysilicon resistor is positioned on a portion of the first heat dissipative element.

12. An integrated circuit (IC) structure comprising:
a first shallow trench isolation (STI) in a substrate;
a second STI in the substrate, the second STI laterally separated from the first STI;
a heat dissipative material in the remaining portion of the substrate;
a first polysilicon resistor in a polysilicon layer, the polysilicon layer positioned directly on the first STI, the second STI and the substrate; and
a second polysilicon resistor in the polysilicon layer, wherein the heat dissipative material is in thermal communication with the first polysilicon resistor and the second polysilicon resistor.

13. The IC structure of claim 12, wherein a width of the first polysilicon resistor and the second polysilicon resistor is approximately 20 nanometers to approximately 5000 nanometers.

14. The IC structure of claim 12, wherein a width of the first heat dissipative element and the second heat dissipative element is approximately 40 nanometers to approximately 5 micrometers.

15. A method of forming heat dissipative elements for polysilicon resistors in an integrated circuit (IC) structure comprising:
forming a heat dissipative element in a substrate by forming at least one shallow trench isolation (STI) within the substrate;
forming a polysilicon layer over the at least one STI and the substrate;
forming a first polysilicon resistor in the polysilicon layer over at least a portion of the at least one STI and in thermal communication with the heat dissipative element; and
forming a second polysilicon resistor in the polysilicon layer laterally separated from the first polysilicon resistor,
wherein a portion of the substrate laterally surrounded by the at least one STI defines the heat dissipative element, and
wherein the heat dissipative element is in thermal communication with the first polysilicon resistor and the second polysilicon resistor.

16. The method of claim 15, wherein the forming the first polysilicon resistor includes forming the first polysilicon resistor having a length in a first directional orientation parallel to a second directional orientation of a length of the heat dissipative element, and wherein the first polysilicon resistor is laterally separated from the heat dissipative element.

17. The method of claim 15, wherein the forming the first polysilicon resistor includes forming the first polysilicon resistor having a length in a first directional orientation perpendicular to a second directional orientation of a length of the heat dissipative element.

18. The method of claim 15, wherein the forming the first polysilicon resistor includes forming the first polysilicon resistor on and in direct contact with at least a portion of the heat dissipative element.

* * * * *